(12) United States Patent
Kuo et al.

(10) Patent No.: US 8,691,652 B2
(45) Date of Patent: Apr. 8, 2014

(54) SEMICONDUCTOR PROCESS

(75) Inventors: Lung-En Kuo, Tainan (TW);
Jiunn-Hsiung Liao, Tainan (TW);
Hsuan-Hsu Chen, Tainan (TW)

(73) Assignee: United Microelectronics Corp.,
Science-Based Industrial Park, Hsin-Chu
(TW)

( * ) Notice: Subject to any disclaimer, the term of this
patent is extended or adjusted under 35
U.S.C. 154(b) by 0 days.

(21) Appl. No.: 13/463,809

(22) Filed: May 3, 2012

(65) Prior Publication Data
US 2013/0295738 A1  Nov. 7, 2013

(51) Int. Cl.
*H01L 21/336* (2006.01)
*H01L 29/78* (2006.01)

(52) U.S. Cl.
USPC ............. 438/283; 257/401; 257/E21.421; 438/926

(58) Field of Classification Search
USPC ........................................... 438/283
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,026,196 B2 * | 4/2006 | Hou et al. | 438/151 |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,528,025 B2 * | 5/2009 | Brask et al. | 438/183 |
| 7,531,437 B2 | 5/2009 | Brask | |
| 7,554,165 B2 * | 6/2009 | Hokazono | 257/401 |
| 7,569,857 B2 | 8/2009 | Shaheen | |
| 7,704,835 B2 | 4/2010 | Singh | |
| 7,915,130 B2 * | 3/2011 | Saito et al. | 438/300 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0004117 A1 * | 1/2007 | Yagishita | 438/197 |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2008/0277742 A1 * | 11/2008 | Hokazono | 257/401 |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |

(Continued)

*Primary Examiner* — Colleen Matthews
*Assistant Examiner* — Regan J Rundio
(74) *Attorney, Agent, or Firm* — Winston Hsu; Scott Margo (57) ABSTRACT

A semiconductor process includes the following steps. A fin-shaped structure is formed on a substrate. A gate structure and a cap layer are formed, wherein the gate structure is disposed across parts of the fin-shaped structure and parts of the substrate, the cap layer is on the gate structure, and the cap layer includes a first cap layer on the gate structure and a second cap layer on the first cap layer. A spacer material is formed to entirely cover the second cap layer, the fin-shaped structure and the substrate. The spacer material is etched, so that the sidewalls of the second cap layer are exposed and a spacer is formed beside the gate structure. The second cap layer is removed.

19 Claims, 5 Drawing Sheets

(56) References Cited

U.S. PATENT DOCUMENTS

| | | |
|---|---|---|
| 2010/0144121 A1 | 6/2010 | Chang |
| 2010/0167506 A1 | 7/2010 | Lin |
| 2011/0089493 A1* | 4/2011 | Lander .......................... 257/347 |
| 2011/0269276 A1* | 11/2011 | Kwon et al. .................. 438/199 |
| 2012/0018848 A1* | 1/2012 | Huang et al. .................. 257/616 |
| 2012/0256238 A1* | 10/2012 | Ning et al. .................... 257/280 |
| 2013/0178024 A1* | 7/2013 | Flachowsky et al. ......... 438/199 |

* cited by examiner

SEMICONDUCTOR PROCESS

BACKGROUND OF THE INVENTION

1. Field of the Invention

The present invention relates generally to a semiconductor process, and more specifically to a semiconductor process that forms two cap layers on a gate structure.

2. Description of the Prior Art

With the increasing miniaturization of semiconductor devices, various Fin-shaped field effect transistor (FinFET) devices have been developed. The Fin-shaped field effect transistor (FinFET) has many advantages. First, manufacturing processes of Fin-shaped field effect transistor (FinFET) devices can be integrated into traditional logic device processes, and are therefore more compatible. In addition, since the three-dimensional structure of the FinFET increases the overlapping area between the gate and the substrate, the channel region is controlled more effectively. This way it reduces the drain-induced barrier lowering (DIBL) effect and short channel effects. Moreover, the channel region is longer for the same gate length, so the current between the source and the drain is increased.

Generally, a fin-shaped field effect transistor comprises a stacked structure including a fin-shaped structure, a gate structure and a cap layer on a substrate, and a spacer beside the gate structure. Forming the spacer method in the fin-shaped field effect transistor process includes using a spacer material that is entirely covered and then etched to form the spacer beside the gate structure. The electrical performances of the fin-shaped field effect transistor can be modified by controlling the relative height of the gate structure and the cap layer. For instance, when the height of the spacer is smaller than the thickness of the gate structure to expose the gate structure, problems such as poly-bump or circuit leakage would occur on the gate structure in sequential processes. When the spacer is higher than the cap layer, the sequential processing time and the processing cost increase, and performing the sequential process becomes harder. Sequential processes such as epitaxial process, salicide process or contact plugs process become harder to be performed as the spacer material on the substrate between the fin-shaped structures can not be etched entirely because the spacer material is etched to form the spacer. When the spacer material on the substrate between the fin-shaped structures is entirely removed by extending the processing time, over-etching of the spacer occurs which causes problems such as the gate structure being exposed.

SUMMARY OF THE INVENTION

The present invention provides a semiconductor process which forms two cap layers on a gate structure. Therefore, as the spacer material is deposited and etched in later processes to form a spacer beside the gate structure, the spacer material between the fin-shaped structures can be entirely removed without over-etching the spacer, which would expose the gate structure.

The present invention provides a semiconductor process including the following steps. A fin-shaped structure is formed on a substrate. A gate structure and a cap layer are formed, wherein the gate structure is disposed across parts of the fin-shaped structure and parts of the substrate, the cap layer is on the gate structure, and the cap layer includes a first cap layer on the gate structure and a second cap layer on the first cap layer. A spacer material is formed to entirely cover the second cap layer, the fin-shaped structure and the substrate. The spacer material is etched, so that the sidewalls of the second cap layer are exposed and a spacer is formed beside the gate structure. The second cap layer is then removed.

According to the above, the present invention provides a semiconductor process, which forms two cap layers on the gate structure. In this way, as the spacer material is deposited and etched after the two cap layers are formed to form the spacer beside the gate structure, the spacer material between the fin-shaped structures can be entirely removed without the spacer being over-etched, thereby avoiding the gate structure being exposed. Therefore, problems such as poly-bump or circuit leakage can be avoided, that would affect the electrical performances of the formed semiconductor structures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
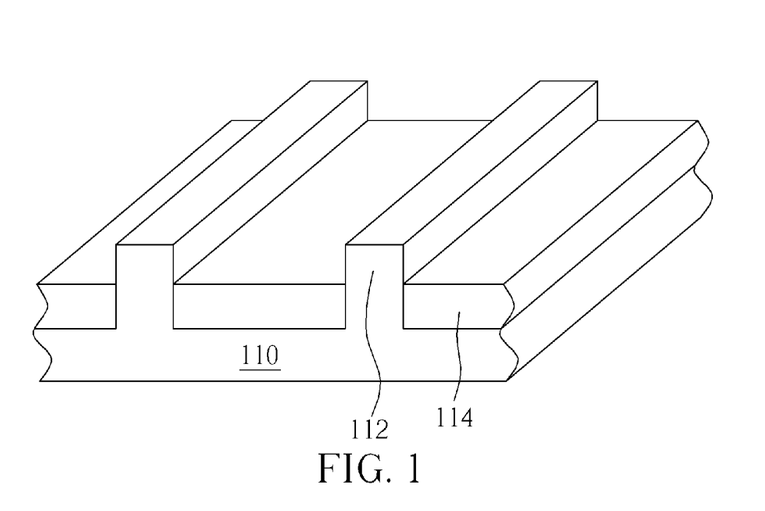
FIGS. 1-9 schematically depict three dimensional diagrams of a semiconductor process according to a first embodiment of the present invention.

FIGS. 1-9 schematically depict three dimensional diagrams of a semiconductor process according to a first embodiment of the present invention. As shown in FIG. 1, a fin-shaped structure 112 is formed on a substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The method of forming the fin-shaped structure 112 may be: a bulk bottom substrate (not shown) is provided. A hard mask layer (not shown) is formed on the bulk bottom substrate (not shown) and is patterned to define the location of the fin-shaped structure 112, which will be formed in the bulk bottom substrate (not shown). An etching process is performed to form the fin-shaped structure 112 in the bulk bottom substrate (not shown). Thus, the fin-shaped structure 112 located on the bottom substrate 112 is formed completely. In one embodiment, the hard mask layer (not shown) is removed after the fin-shaped structure 112 is formed, and a tri-gate MOSFET can be formed in the following processes. There are three contact faces between the fin structure 120 and the following formed dielectric layer functioning as a carrier channel which width is wider than a channel width in a conventional planar MOSFET. When a driving voltage is applied, the tri-gate MOSFET produces on-current twice higher compared to conventional planar MOSFETs. In another embodiment, the hard mask layer (not shown) is reserved to form another kind of multi-gate MOSFET. Due to the hard mask layer (not shown) being reserved in the fin field effect transistor, there are only two contact faces between the fin-shaped structure 112 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning the fin-shaped structure formed on the silicon-on-insulator substrate (not shown) is finished. In order to clarify the present invention, one fin-shaped structure 112 is depicted in this embodiment, but the present invention can also be applied to a plurality of fin-shaped structures 112. Then, shallow trench isolation (STI) structures 114 may be formed between each fin-shaped structure 112.

Figure 2:
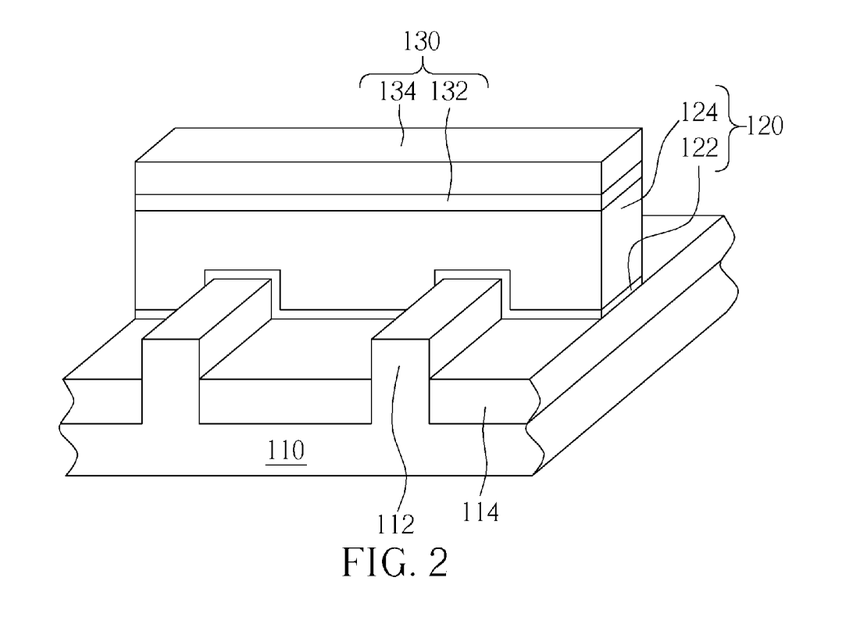

As shown in FIG. 2, a gate structure 120 is formed and disposed across parts of the fin-shaped structure 112 and parts of the substrate 110. The gate structure 120 may include a buffer layer (not shown), a dielectric layer 122 and a gate layer 124. A cap layer 130 further included on the gate structure 120 is used as a hard mask while the etching process is performed. The cap layer 130 is a stacked structure, which includes a first cap layer 132 on the gate structure 120 and a second cap layer 134 on the first cap layer 132. More precisely, a buffer layer material (not shown), a dielectric layer material (not shown), a gate layer material (not shown), a first cap layer material (not shown) and a second cap layer material (not shown) are entirely and sequentially covered. Then, the second cap layer material (not shown), the first cap layer material (not shown), the gate layer material (not shown), the dielectric layer material (not shown), the buffer layer material (not shown) are patterned to form a stacked structure including a buffer layer (not shown), a dielectric layer 122, a gate layer 124, a first cap layer 132 and a second cap layer 134.

The buffer layer (not shown) may be an oxide layer, and the dielectric layer 122 may be a dielectric layer having a dielectric constant, such as a group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). In this embodiment, the gate layer 124 is a sacrificial polysilicon gate layer that will be replaced with a metal gate in later processes. In another embodiment, the gate layer 124 may be a polysilicon layer or a metal layer etc. In this embodiment, the first cap layer 132 is a nitride layer and the second cap layer 134 is an oxide layer, but it is not limited thereto. In a preferred embodiment, the first cap layer 132 and the second cap layer 134 have different etching rate selectivity, which means that both of them have different etching rate during an etching process. In this way, the first cap layer 132 can be reserved without being damaged by over-etching as the second cap layer 134 is removed in later processes.

Figure 3:
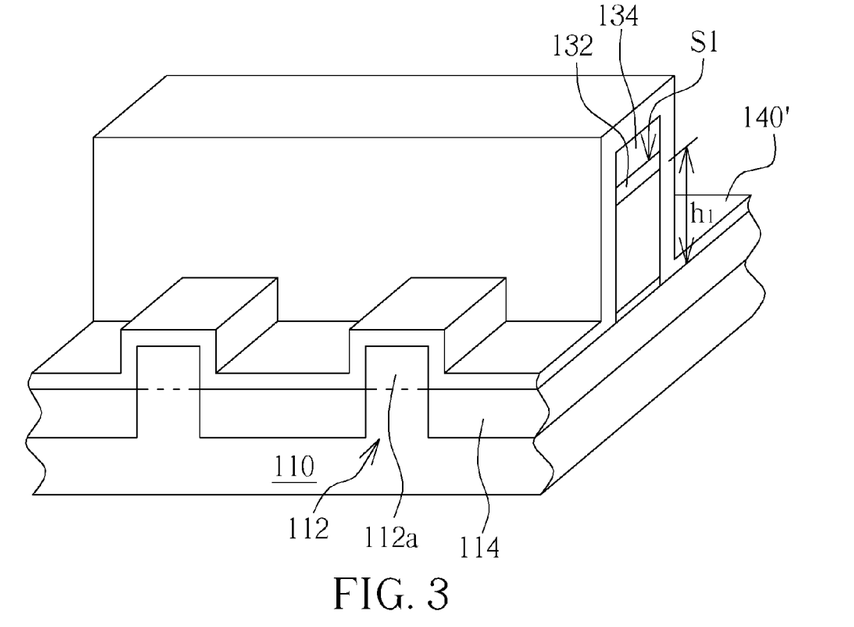

As shown in FIG. 3, a spacer material 140' is formed to entirely cover the second cap layer 134, the fin-shaped structure 112 and the substrate 110. The spacer material 140' may be a single layer or a multilayer composed of silicon nitride or silicon oxide etc.

Figure 4:
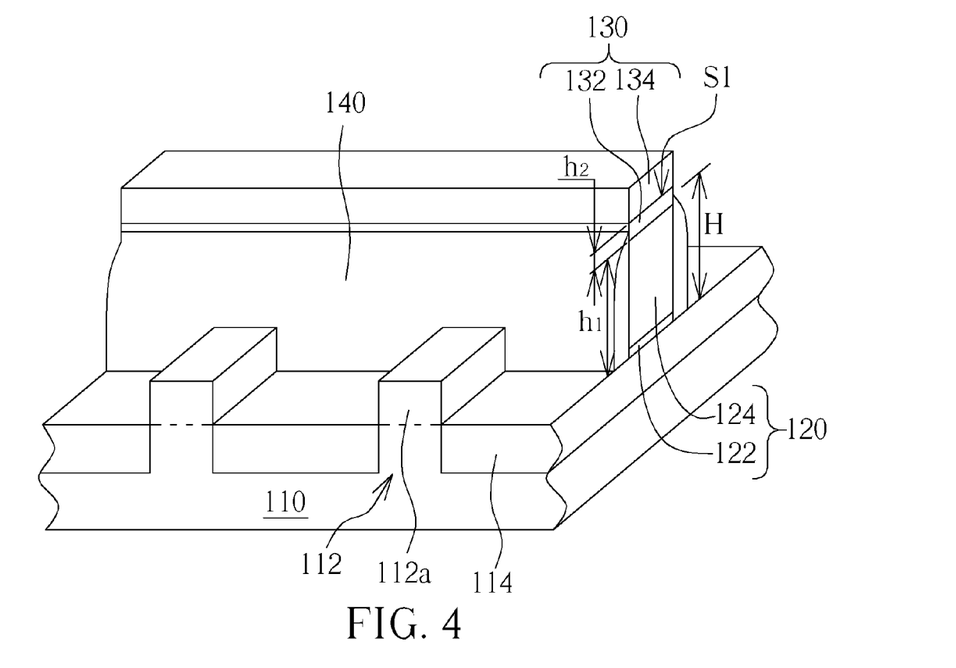
Figure 5:
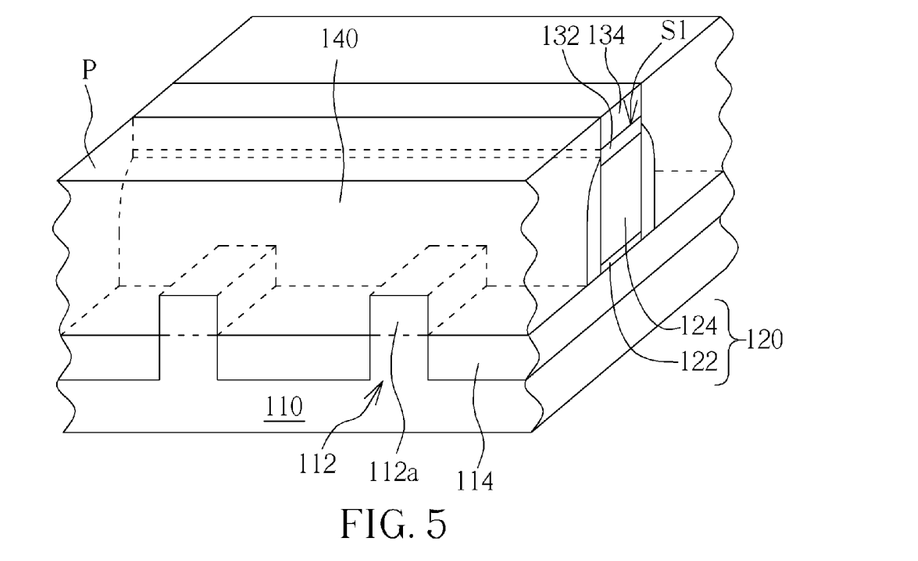
Figure 6:
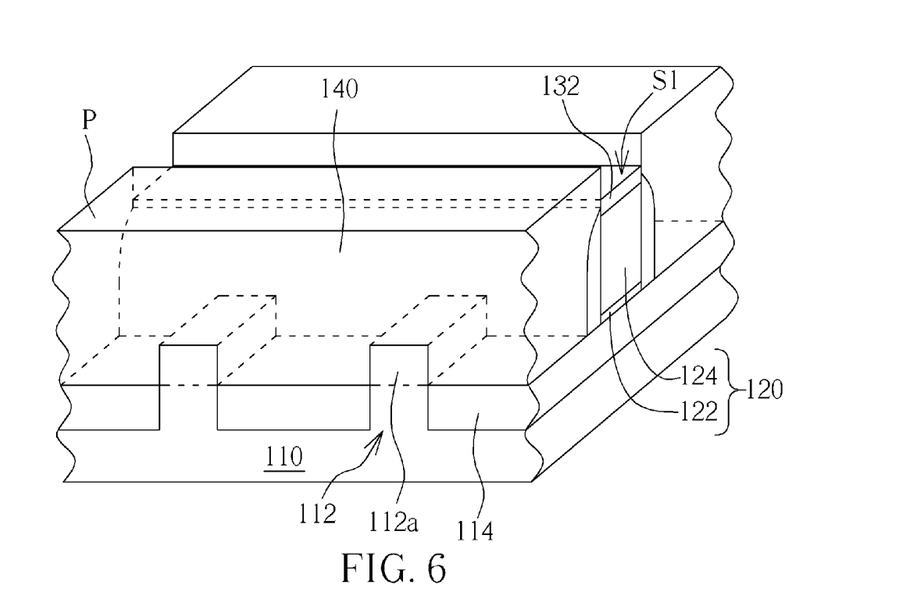
Figure 10:
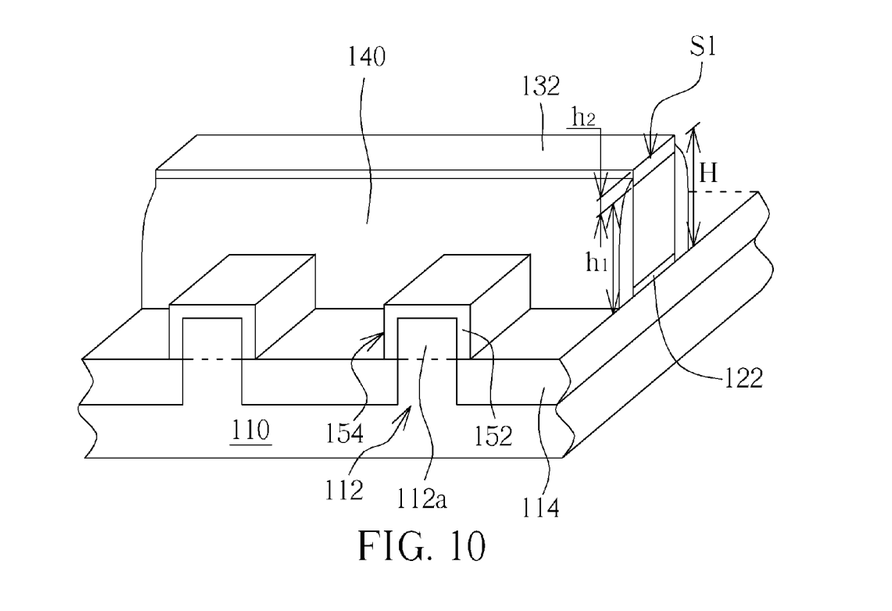
FIG. 10 schematically depicts a three dimensional diagram of a semiconductor process according to a second embodiment of the present invention.

A first embodiment shown in FIGS. 4-6 is presented in the following paragraphs, and a second embodiment shown in FIG. 10 is presented in the following paragraphs. The difference between the two embodiments depends upon the etching rate selectivity of the second cap layer 134 and the spacer material 140' and upon the relative thicknesses of the second cap layer 134 and part of the fin-shaped structure 112a protruding from the shallow trench isolation (STI) structures 114.

First Embodiment

As shown in FIG. 4, the spacer material 140' is etched to form a spacer 140 on parts of the substrate 110 beside the gate structure 120. Basically, the spacer 140 is not formed beside the fin-shaped structure 112. More precisely, the height H of the spacer 140 is larger than or equal to the thickness h1 of the gate structure 120, but smaller than or equal to the thickness h1+h2 of the gate structure 120 plus the first cap layer 132, which means that the top surface of the spacer 140 is leveled with the sidewalls of the first cap layer 132, and the sidewalls of the second cap layer 134 is exposed. Thus, the gate structure 120 are prevented from being exposed, and the spacer 140 will not protrude from the top surface S1 of the first cap layer 132 as the second cap layer 134 is removed in later processes. For example, the height H of the spacer 140 can be controlled by adjusting the thickness of the second cap layer 134, or/and selecting suitable etching rate selectivity of the second cap layer 134 and the spacer material 140'. For instance, as the second cap layer 134 and the part of the fin-shaped structure 112a protruding from the shallow trench isolation (STI) structures 114 have the same thicknesses, the material of the second cap layer 134 may be chosen having an etching rate lower than that of the material of the spacer material 140'. Due to the etching rate of the spacer material 140' being larger than that of the second cap layer 134, the second cap layer 134 remains and the sidewalls of the second cap layer 134 are exposed as the spacer 140 is formed. At this time, the spacer material 140' between the fin-shaped structures 112 is entirely removed except the spacer 140. In addition, as the etching rate of the second cap layer 134 is equal to the etching rate of the spacer material 140', the thickness of the second cap layer 134 can be larger than the thickness of the part of the fin-shaped structure 112a protruding from the shallow trench isolation (STI) structures 114. By doing this, the second cap layer 134 still remains, the sidewalls of the second cap layer 134 are exposed, and the spacer material 140' between the fin-shaped structures 112 is entirely removed except the spacer 140. In another way, the second cap layer 134 and the spacer material 140' may have different etching rate selectivity, and the second cap layer 134 and the part of the fin-shaped structure 112a protruding from the shallow trench isolation (STI) structures 114 may have different thicknesses, depending upon processing and structural needs. Due to the spacer material 140' being a single-layer or multilayer structure composed of silicon nitride or silicon oxide etc, the spacer 140 may also be a single-layer or multilayer structure composed of silicon nitride or silicon oxide, etc.

As shown in FIGS. 5-6, the second cap layer 134 above the first cap layer 132 is removed. More precisely, as shown in FIG. 5, a photoresist P is formed to cover the fin-shaped structure 112 and the substrate 110 while the second cap layer 134 is exposed. As shown in FIG. 6, the second cap layer 134 is removed. The photoresist P is then removed.

In this embodiment, the height H of the spacer 140 can be well-controlled by adjusting the etching rate selectivity and the relative thicknesses. However, in another embodiment, the spacer 140 may protrude from the top surface S1 of the first cap layer 132, and part of the spacer 140 protruding from the first cap layer 132 then needs to be further removed by other processes, such as a planarization process, but not limited to this.

In this embodiment, the spacer 140 is formed and then the second cap layer 134 is entirely removed. In another embodiment, the spacer 140 is formed while the second cap layer 134 is entirely removed.

The Second Embodiment

As shown in FIG. 10, the second cap layer 134 is entirely removed when the spacer 140 is formed by etching the spacer material 140'. More precisely, as the etching rate of the second cap layer 134 is equal to the etching rate of the spacer material 140', the thickness of the second cap layer 134 can be equal to the thickness of the part of the fin-shaped structure 112a protruding from the shallow trench isolation (STI) structures 114. Therefore, the second cap layer 134 can be entirely removed while the spacer 140 is formed, and the spacer material 140' between the fin-shaped structures 112 can be entirely removed, except the spacer 140. The spacer 140 is formed while the second cap layer 134 is removed and the spacer material 140' between the fin-shaped structures 112 can be entirely removed (except the spacer 140) by adjusting the etching rate of the second cap layer 134 and the spacer material 140', or the thicknesses of the second cap layer 134 and the part of the fin-shaped structure 112a protruding from the shallow trench isolation (STI) structures 114. In a preferred embodiment, the height H of the formed spacer 140 is larger than the thickness h1 of the gate structure 120 but smaller than the thickness h1+h2 of the gate structure 120 plus the first cap layer 132. In this way, the problems of the gate structure 120 being exposed and the spacer 140 protruding from the top surface S1 of the first cap layer 132 can be avoided.

According to said two embodiments, the height of the spacer 140 formed by etching the spacer material 140' is preferred to be larger than or equal to the thickness h1 of the gate structure 120 to prevent the gate structure 120 form being exposed. Besides, the height of the spacer 140 is preferred to be lower than or equal to the top surface S1 of the first cap layer 132 to prevent the spacer 140 from protruding from the first cap layer 132 after the second cap layer 134 is removed in later processes, which increases the processing time, costs and difficulties. Furthermore, as the spacer 140 is formed, the spacer material 140' (except the spacer 140) needs to be entirely removed. However, the spacer material 140' on the substrate 110 between the fin-shaped structures 112 still remains after the spacer 140 is formed in the prior art. If the spacer material 140' is over-etched, the spacer 140 will be over-etched too and the gate structure 120 will therefore be exposed. The present invention solves these problems by methods of forming the first cap layer 132 and the second cap layer 134.

Figure 7:
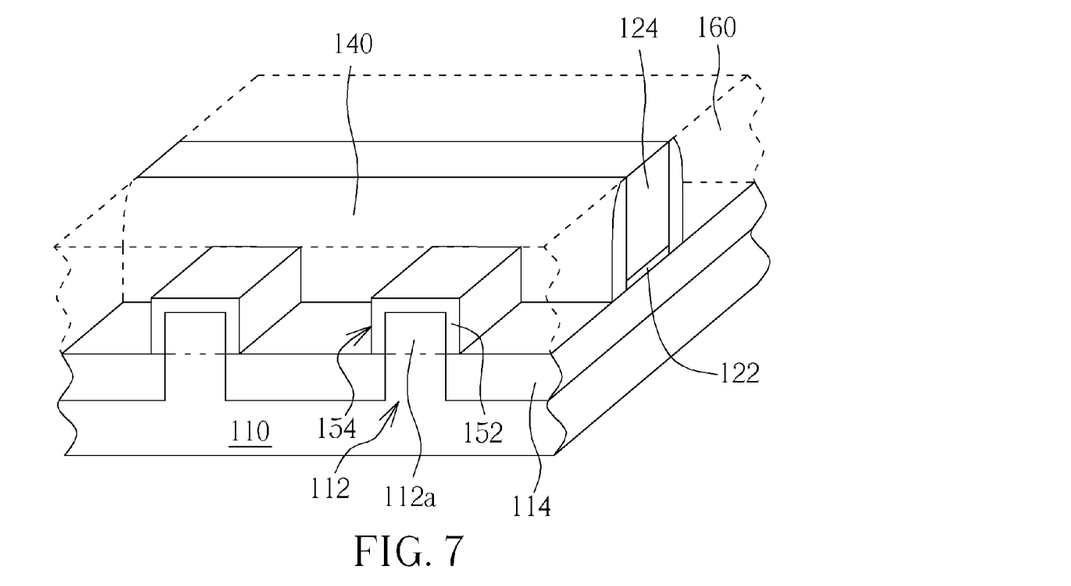

As shown in FIG. 7, an epitaxial structure 152 may be selectively formed on the fin-shaped structure 112 after the spacer 140 is formed as shown in FIGS. 4-6 (or FIG. 10). In another embodiment, the epitaxial structure 152 may be formed in the fin-shaped structure 112. In this embodiment, the epitaxial structure 152 is formed after the second cap layer 134 is removed. In another embodiment, the epitaxial structure 152 may be formed before the second cap layer 134 is removed, depending upon processing needs. A source/drain region 154 is formed in the fin-shaped structure 112 beside the spacer 140 by methods such as an inclination ion implantation process. In the present invention, the source/drain region 154 is formed after the second cap layer 134 is removed, thereby allowing the inclination ion implantation process to be performed on the top and the sidewalls of the fin-shaped structure 112, and the source/drain region 154 can therefore be formed in the fin-shaped structure 112, but it is not limited thereto. In this embodiment, the source/drain region 154 is entirely in the epitaxial structure 152. In another embodiment, the epitaxial structure 152 may be in the source/drain region 154 entirely, or the epitaxial structure 152 partially overlaps the source/drain region 154.

Salicide (not shown) may be selectively formed on the source/drain region 154, then a contact etch stop layer (CESL) and an interdielectric layer may entirely cover the fin-shaped structure 112, the substrate 110 and the first cap layer 132. Thereafter, the interdielectric layer (not shown) may be planarized by methods such as a chemical mechanical polishing (CMP) process, and the first cap layer 132 may be also removed while planarizing, so that an interdielectric layer 160 is formed while the gate layer 124 is exposed.

Figure 8:
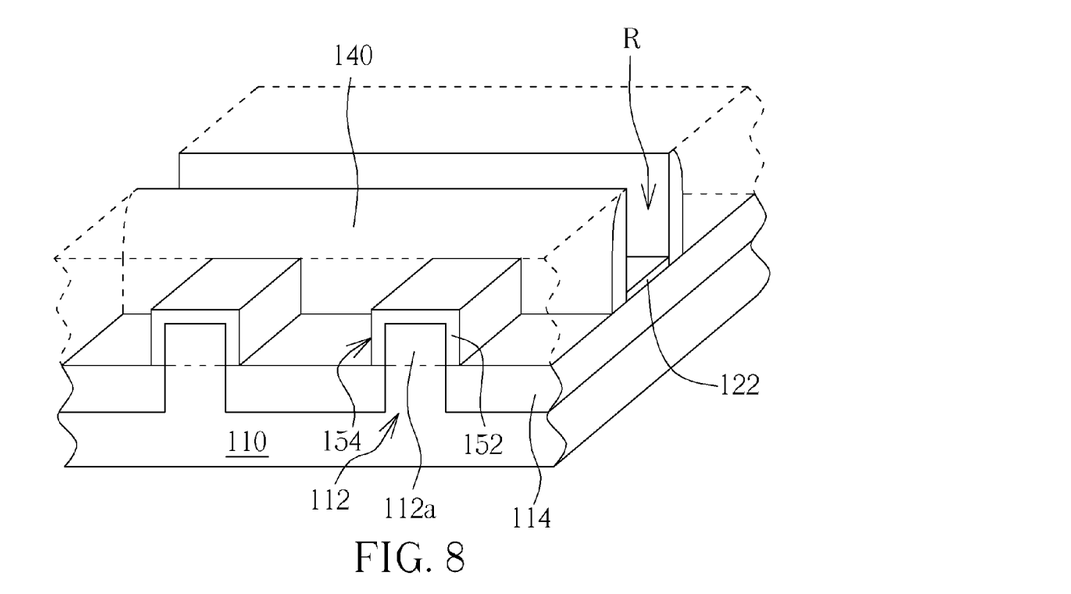
Figure 9:
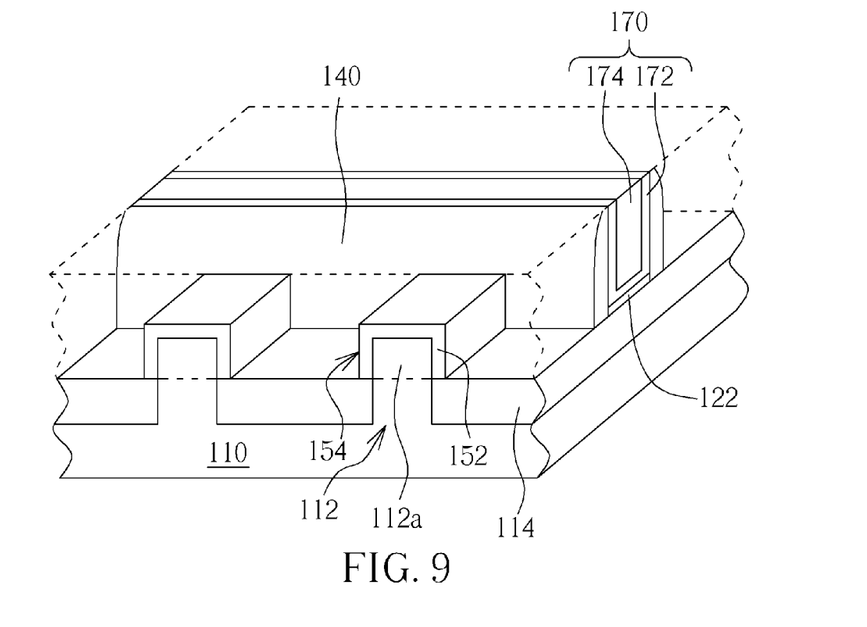

As shown in FIGS. 8-9, a metal gate replacement process is performed to replace the gate layer 124 with the metal gate 170. More precisely, as shown in FIG. 8, the gate layer 120 may by removed by an etching process to form a recess R. Gate last for high-k first process is applied in the present invention, so that the dielectric layer 122 is exposed after the recess R is formed. In another embodiment, when a gate last for high-k last process is applied, the dielectric layer 122 will also be etched and the buffer layer (not shown) will be exposed, but it is not limited thereto. Additionally, a gate last for high-k last process, a buffer layer first process, a gate last for high-k last process, a buffer layer last process, or etc may be applied.

As shown in FIG. 9, a barrier layer (not shown) may be selectively formed to totally cover the recess R, wherein the barrier layer (not shown) may be a single layer or multilayer structure composed of titanium, titanium nitride, tantalum, tantalum nitride or etc, to prevent metal atoms above the barrier layer (not shown) from diffusing downward. A work function metal layer (not shown) and a low resistivity material (not shown) are sequentially formed on the barrier layer (not shown), and then the low resistivity material (not shown), the work function metal layer (not shown) and the barrier layer (not shown) are planarized to form a barrier layer (not shown), a work function metal layer 172 and a low resistivity material 174 in the recess R. Thus, the Fin-shaped field effect transistor (FinFET) device is formed. The work function metal layer 172 is a metal suitable for the needed work function value of the transistor, and the work function metal layer 172 may be a single layer or multilayer structure composed of metals such as titanium nitride (TiN), titanium carbide (TiC), tantalum nitride (TaN), tantalum carbide (TaC), tungsten carbide (WC), titanium aluminide (TiAl) or aluminum titanium nitride (TiAlN) or etc. The work function metal layer 170 may be a titanium nitride metal layer suited for a PMOS transistor (the work function value is between 4.8 ev to 5.2 ev). The work function metal layer 170 may be an aluminum titanium metal layer suited for a NMOS transistor (the work function value is between 3.9 ev to 4.3 ev). The low resistivity material 174 may be made of aluminum, tungsten, titanium aluminide alloy or cobalt tungsten phosphide (CoWP) etc.

To summarize, the present invention provides a semiconductor process, which forms a stacked structure including a first cap layer and a second cap layer on the gate structure. In this way, as the spacer is formed beside the gate structure by depositing and etching the spacer material, the spacer material between the fin-shaped structures can be entirely removed without over-etching the spacer, and the exposure of the gate structure can therefore be avoided. Thus, problems such as poly-bump or circuit leakage can be avoided, which could degrade the electrical performances of the formed semiconductor structure. More precisely, said purposes can be achieved by adjusting the etching rate selectivity of the second cap layer and the spacer material, or/and the relative thicknesses of the second cap layer and the part of the fin-shaped structure protruding from the shallow trench isolation (STI) structures. The forming steps may include the following. Method 1: the spacer is formed by etching the spacer material, the second cap layer is exposed, and then the second cap layer is removed. Method 2: as the spacer is formed by etching the spacer material, the second cap layer is entirely removed at the same time. In another way, the first cap layer and the second cap layer are preferred to have a different etching rate selectivity, which means that the first cap layer and the second cap layer have different etching rates. Therefore, as the second cap layer is removed, the first cap layer is entirely reserved without being damaged by over-etching.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   forming a fin-shaped structure on a substrate;
   forming a gate structure and a cap layer, wherein the gate structure is disposed across parts of the fin-shaped structure and parts of the substrate, the cap layer is on the gate structure, and the cap layer comprises a first cap layer on the gate structure and a second cap layer on the first cap layer;
   forming a spacer material entirely covering the second cap layer, the fin-shaped structure and the substrate;
   etching the spacer material to expose entire sidewalls of the second cap layer to form a spacer beside the gate structure and then covering partial sidewalls of the first cap layer; and
   removing the second cap layer.

2. The semiconductor process according to claim 1, wherein the first cap layer and the second cap layer have different etching rate selectivity.

3. The semiconductor process according to claim 2, wherein the first cap layer comprises a nitride layer and the second cap layer comprises an oxide layer.

4. The semiconductor process according to claim 2, wherein the second cap layer and the spacer material have different etching rates.

5. The semiconductor process according to claim 4, wherein the spacer material comprises a nitride layer and the second cap layer comprises an oxide layer.

6. The semiconductor process according to claim 1, wherein the second cap layer is entirely removed after the spacer material is etched.

7. The semiconductor process according to claim 1, wherein the second cap layer is entirely removed as the spacer material is etched.

8. The semiconductor process according to claim 1, wherein the thickness of the second cap layer is equal to the thickness of the fin-shaped structure.

9. The semiconductor process according to claim 1, wherein the thickness of the cap layer is larger than the thickness of the fin-shaped structure.

10. The semiconductor process according to claim 1, further comprising:
    forming a source/drain region in the fin-shaped structure beside the spacer after the second cap layer is removed.

11. The semiconductor process according to claim 1, further comprising:
    forming an epitaxial structure on the fin-shaped structure or in the fin-shaped structure before the source/drain region is formed.

12. The semiconductor process according to claim 11, wherein the epitaxial structure is formed after the second cap layer is removed.

13. The semiconductor process according to claim 11, wherein the epitaxial structure is formed before the second cap layer is removed.

14. The semiconductor process according to claim 10, further comprising:
    forming an interdielectric layer to entirely cover the first cap layer, the fin-shaped structure and the substrate after the source/drain region is formed; and
    planarizing the interdielectric layer until the first cap layer is removed.

15. The semiconductor process according to claim 10, further comprising:
    performing a metal gate replacement process after the first cap layer is removed.

16. The semiconductor process according to claim 1, wherein the spacer material except the spacer is entirely removed when the spacer material is etched.

17. The semiconductor process according to claim 1, wherein the sidewalls of the second cap layer are entirely exposed as the spacer material is etched.

18. The semiconductor process according to claim 1, wherein the height of the spacer is larger than the thickness of the gate structure and smaller than the thickness of the gate structure plus the first cap layer.

19. The semiconductor process according to claim 1, further comprising:
    forming a shallow trench isolation structure between the gate structure and part of the substrate before the gate structure is formed.

* * * * *